US010062795B2

(12) United States Patent
Nishioka et al.

(10) Patent No.: US 10,062,795 B2
(45) Date of Patent: Aug. 28, 2018

(54) SEALING SHEET FOR SOLAR CELL

(71) Applicant: DAI NIPPON PRINTING CO., LTD., Shinjuku-ku (JP)

(72) Inventors: Jun Nishioka, Nagahama (JP); Kouichirou Taniguchi, Nagahama (JP); Yo Miyashita, Nagahama (JP); Michiko Otsuka, Nagahama (JP); Shinya Fukuda, Nagahama (JP)

(73) Assignee: DAI NIPPON PRINTING CO., LTD., Shinjuku-ku (JP)

( * ) Notice: Subject to any disclaimer, the term of this patent is extended or adjusted under 35 U.S.C. 154(b) by 307 days.

(21) Appl. No.: 14/376,722

(22) PCT Filed: Feb. 5, 2013

(86) PCT No.: PCT/JP2013/052622
§ 371 (c)(1),
(2) Date: Aug. 5, 2014

(87) PCT Pub. No.: WO2013/118729
PCT Pub. Date: Aug. 15, 2013

(65) Prior Publication Data
US 2014/0360573 A1 Dec. 11, 2014

(30) Foreign Application Priority Data
Feb. 6, 2012 (JP) .................. 2012-023218

(51) Int. Cl.
*H01L 31/048* (2014.01)
*B32B 27/32* (2006.01)
*C08L 23/08* (2006.01)
*H01L 31/049* (2014.01)
*B32B 27/08* (2006.01)
*B32B 27/18* (2006.01)

(52) U.S. Cl.
CPC .......... *H01L 31/0481* (2013.01); *B32B 27/08* (2013.01); *B32B 27/18* (2013.01); *B32B 27/32* (2013.01); *C08L 23/08* (2013.01); *H01L 31/049* (2014.12); B32B 2250/02 (2013.01); B32B 2307/306 (2013.01); B32B 2307/3065 (2013.01); B32B 2307/4026 (2013.01); B32B 2307/412 (2013.01); B32B 2307/54 (2013.01); B32B 2307/558 (2013.01); B32B 2307/712 (2013.01); B32B 2307/7246 (2013.01); B32B 2457/00 (2013.01); B32B 2581/00 (2013.01); C08L 23/0815 (2013.01); Y02E 10/50 (2013.01)

(58) Field of Classification Search
CPC ... H01L 31/0481; H01L 31/049; B32B 27/08; B32B 27/18; B32B 27/32; B32B 2581/00; B32B 2250/02; B32B 2307/306; B32B 2307/3065; B32B 2307/4026; B32B 2307/412; B32B 2307/54; B32B 2307/558; B32B 2307/712; B32B 2307/7246; B32B 2457/00; C08L 23/08; C08L 23/0815; Y02E 10/50
USPC ........................................................ 136/256
See application file for complete search history.

(56) References Cited

U.S. PATENT DOCUMENTS

| 2,426,730 | A | 9/1947 | De Vita | |
|---|---|---|---|---|
| 2004/0163700 | A1* | 8/2004 | Mizuta | .................. H01G 9/2013 136/263 |
| 2005/0279401 | A1* | 12/2005 | Arhart | ............... B32B 17/10743 136/251 |
| 2008/0311812 | A1 | 12/2008 | Arriola et al. | |
| 2010/0313956 | A1* | 12/2010 | Nishijima | ............... C08L 23/02 136/259 |
| 2011/0100416 | A1* | 5/2011 | Kataoka | ............ B32B 17/10688 136/244 |
| 2011/0124818 | A1 | 5/2011 | Arriola et al. | |
| 2011/0303264 | A1 | 12/2011 | Taniguchi et al. | |
| 2013/0118584 | A1 | 5/2013 | Taniguchi et al. | |

FOREIGN PATENT DOCUMENTS

| CN | 1073137 A | 6/1993 |
|---|---|---|
| EP | 0 490 335 A2 | 6/1992 |
| JP | 59-022978 | 2/1984 |
| JP | 2010-192804 | 9/2010 |
| JP | 2010-232311 | 10/2010 |
| JP | 2011-035290 | 2/2011 |
| WO | WO 2007/088892 A1 | 8/2007 |
| WO | 2012/014965 | 2/2012 |

OTHER PUBLICATIONS

Machine Translation of JP 2010-192804. 2010.*
International Search Report dated Mar. 12, 2013, in PCT/JP13/052622, filed Feb. 5, 2013.
Extended European Search Report dated Jun. 10, 2015 in Patent Application No. 13746103.4.
Combined Office Action and Search Report dated Nov. 12, 2015 in Chinese Patent Application No. 201380008105.5 (with English translation of Categories of Cited Documents).
U.S. Appl. No. 13/812,378, filed Jan. 25, 2013, US2013/0118584 A1, Taniguchi, et al.
U.S. Appl. No. 14/371,862, filed Jul. 11, 2014, Taniguchi, et al.

* cited by examiner

Primary Examiner — Brian Handville
(74) Attorney, Agent, or Firm — Oblon, McClelland, Maier & Neustadt, L.L.P.

(57) ABSTRACT

A solar cell encapsulant sheet including a resin layer (S) formed of a resin composition containing an olefine-based resin, wherein the storage elastic modulus at 25° C. of the resin layer (S) is 200 MPa or less, at least one surface of the resin layer (S) is the sheet surface of the encapsulant sheet, and the sheet surface satisfies the following requirements (a), (b) and (c): (a) the dynamic friction coefficient on a tempered white glass plate is 1.5 or less, (b) the surface roughness Rzjis is from 0.1 to 50 μm, and (c) the static friction coefficient on a tempered white glass plate is 1.5 or less.

13 Claims, No Drawings

SEALING SHEET FOR SOLAR CELL

TECHNICAL FIELD

The present invention relates to an encapsulant sheet for solar cells and to a solar cell module containing the sheet.

BACKGROUND ART

A solar cell module that comprises a semiconductor wafer of silicon or selenium is one produced by laminating a solar cell encapsulant sheet of a resin such as ethylene-vinyl acetate copolymer, polyethylene or the like on both sides of a solar cell device, further laminating an upper protective material on the top of the solar cell encapsulant sheet and a lower protective material on the back thereof, and degassing and heating in vacuum to encapsulate the solar cell device with the solar cell encapsulant sheets thereby bonding and integrating the solar cell device and the upper and lower protective materials via the solar cell encapsulant sheets.

The solar cell encapsulant sheet is generally produced as a long sheet through extrusion, and is, until before use, stored and transported as a roll that has been rolled up around a roll core. While in this state, pressure by rolling is given to the solar cell encapsulant sheet in the internal and external directions. Accordingly, the solar cell sheets that are neighbor to each other in the internal and external directions block together, therefore providing a so-called blocking phenomenon by which the solar cell encapsulant sheet could not be smoothly unwinded during use.

PTL 1 discloses a filling adhesive sheet for solar cell modules which is formed of a forming material that contains an ethylenic copolymer and an organic peroxide and which is embossed on both surfaces thereof, for the purpose of preventing blocking of solar cell encapsulant sheets. PTL 2 discloses a solar cell encapsulant sheet which is formed of an ethylene-vinyl acetate copolymer (EVA) having a melt flow rate falling within a specific range and which is embossed on one surface thereof to have an embossed pattern having a specific height and a specific profile.

CITATION LIST

Patent Literature

PTL 1: JP-A 59-22978
PTL 2: JP-A 2010-232311

SUMMARY OF INVENTION

Technical Problem

However, the forming material for use for the sheet described in PTL 1 contains a crosslinking agent (organic peroxide), and therefore often provides some disadvantages such as air staying and the like in production of solar cell modules. The embossing in PTL 2 gives roughness having a height of from 390 to 480 μm (paragraph 0041, Examples 1 to 4). However, in the case where such a soft encapsulant sheet is too deeply embossed, the embossed profiles are often crushed. As a result, the contact area between the encapsulant sheets increases, therefore causing a risk that the blocking preventing effect would be insufficient.

From the demand in the recent environmental policy and energy policy, the importance of the solar cell market is recognized more and more, and the improvement in the productivity of solar cell modules is strongly desired. In particular, among the current situation where tact time reduction and yield increase are needed in a process of module production, roll trouble such as blocking and quality trouble in module production are serious problems.

The problem of blocking of encapsulant sheets and the difficulty in peeling during sheet formation would have some influence on the quality of solar cell modules. In a process of producing solar cell modules, glass, an encapsulant sheet, a solar cell device, an encapsulant sheet, a back sheet and others are laminated, and various types of materials are to be laminated. In the operation of laminating these at given positions, when the members poorly slip between them, in particular, when the interlayer slipping between glass/encapsulant sheet as well as between encapsulant sheet/back sheet is poor, then there may occur some trouble of wrinkle formation or air penetration to stay (wrinkling or air staying), therefore causing quality disadvantages.

Specifically, an object of the present invention is to provide a solar cell encapsulant sheet which overcomes roll trouble such as blocking, which is excellent in productivity, and which is free from quality disadvantages of wrinkling or air staying.

Solution to Problem

As a result of assiduous studies, the present inventors have found that, from a roll of a solar cell encapsulant sheet, the encapsulant sheet can be smoothly unwinded by taking the following two points into consideration, and have reached the present invention. One point is that the storage elastic modulus of the resin layer to constitute the encapsulant sheet is controlled to fall within a specific range to thereby make the solar cell encapsulant sheets that are neighbor to each other in the internal and external directions readily peel from each other. Another point is that the surface profile is specifically so defined that the dynamic friction coefficient, the static friction coefficient and the surface roughness that are described below each could fall within a specific range, thereby preventing any firm bonding of the solar cell encapsulant sheets that are neighbor to each other in the internal and external directions.

Specifically, the present invention relates to the following [1] to [10].

[1] A solar cell encapsulant sheet including a resin layer (S) formed of a resin composition containing an olefine-based resin, wherein the storage elastic modulus at 25° C. of the resin layer (S) is 200 MPa or less, at least one surface of the resin layer (S) is the sheet surface of the encapsulant sheet, and the sheet surface satisfies the following requirements (a), (b) and (c):

(a) the dynamic friction coefficient on a tempered white glass plate is 1.5 or less,
(b) the surface roughness Rzjis is from 0.1 to 50 μm, and
(c) the static friction coefficient on a tempered white glass plate is 1.5 or less.

[2] The solar cell encapsulant sheet according to the above [1], wherein the sheet surface further satisfies the following requirement (d):

(d) the surface roughness Ra is from 0.5 to 5 μm.

[3] The solar cell encapsulant sheet according to the above [1] or [2], wherein the storage elastic modulus at 25° C. of the resin layer (S) is 100 MPa or less.

[4] The solar cell encapsulant sheet according to any one of the above [1] to [3], wherein the surface roughness Rzjis is from 5 to 40 μm.

[5] The solar cell encapsulant sheet according to any one of the above [1] to [4], wherein the olefine-based resin is an ethylene-α-olefin copolymer.

[6] The solar cell encapsulant sheet according to any one of the above [1] to [5], wherein the storage elastic modulus at 25° C. of the resin layer (S) is 50 MPa or less.

[7] The solar cell encapsulant sheet according to any one of the above [1] to [6], which is a laminate of at least two layers including the resin layer (S) and any other resin layer (T) than the resin layer (S).

[8] The solar cell encapsulant sheet according to the above [7], wherein the laminate has a two-type three-layer configuration that has the resin layer (S), the resin layer (T) and the resin layer (S) as laminated in that order.

[9] A solar cell encapsulant sheet roll formed by rolling up the solar cell encapsulant sheet of any one of the above [1] to [8].

[10] A solar cell module that includes the solar cell encapsulant sheet of any one of the above [1] to [9].

Advantageous Effects of the Invention

The solar cell encapsulant sheet of the present invention can be produced efficiently in a roll-to-roll working system with no trouble of blocking in unwinding. Further, the solar cell encapsulant sheet of the present invention can efficiently produce high-quality solar cell modules with little wrinkling and little air staying in a process of producing solar cell modules.

DESCRIPTION OF EMBODIMENTS

The present invention is described in detail below.

<Solar Cell Encapsulant Sheet>

The solar cell encapsulant sheet of the present invention is a solar cell encapsulant sheet including a resin layer (S) formed of a resin composition containing an olefine-based resin, wherein the storage elastic modulus at 25° C. of the resin layer (S) is 200 MPa or less, at least one surface of the resin layer (S) is the sheet surface of the encapsulant sheet, and the sheet surface satisfies the following requirements (a), (b) and (c):

(a) the dynamic friction coefficient on a tempered white glass plate is 1.5 or less, (b) the surface roughness Rzjis is from 0.1 to 50 μm, and (c) the static friction coefficient on a tempered white glass plate is 1.5 or less.

In the solar cell encapsulant sheet of the present invention, the storage elastic modulus of the resin layer (S) falls within a specific range, and the sheet has a specific sheet surface, and consequently, the handleability of the sheet is improved and the sheet can prevent blocking, and in addition, in a process of producing solar cell modules, the sheet can prevent wrinkling and air staying, and is therefore excellent in productivity and quality.

The solar cell encapsulant sheet includes a resin layer (S) of which the storage elastic modulus at 25° C. is 200 MPa or less. Having the storage elastic modulus of 200 MPa or less, the sheet is advantageous for protecting the solar cell device in a solar cell module. The storage elastic modulus of more than 200 MPa would bring about a risk of wrinkling, air staying or cell breakage, in a process of producing solar cell modules.

The storage elastic modulus is preferably 100 MPa or less, more preferably 50 MPa or less, from the viewpoint of preventing blocking and preventing wrinkling, air staying and cell breakage in a process of producing solar cell modules. Also from the viewpoint of securing the handleability and the flex tolerance of flexible solar cell modules, the storage elastic modulus is preferably 5 MPa or more, more preferably 10 MPa or more.

In the present invention, the resin to be contained in the resin composition is not specifically defined so far as it is an olefine-based resin and can control the storage elastic modulus of the resin layer (S) formed of the resin composition to be 200 MPa or less. In the present invention, the resin to be contained in the resin composition is preferably an olefine-based resin of the following (A) to (D). Here, from the viewpoint of good flexibility of the resin layer (S) to be formed, few fish eyes (gel) in the layer, few corrosive substances (acetic acid, etc.) in circuits and good economic potential, preferred are those of (A) or (B); and above all, more preferred are those of (A) from the viewpoint of excellent low-temperature properties.

Olefine-Based Resin (A)

The olefine-based resin (A) is an ethylene-α-olefin copolymer. Here, the α-olefin to copolymerize with ethylene is preferably an α-olefin having from 3 to 20 carbon atoms. Concretely, there are exemplified propylene, 1-butene, 1-pentene, 1-hexene, 1-heptene, 1-octene, 1-nonene, 1-decene, 3-methyl-butene-1, 4-methyl-pentene-1, etc.

In the present invention, from the viewpoint of the industrial availability, various properties and the economic potential thereof, use of propylene, 1-butene, 1-hexene or 1-octene is preferred as the α-olefin to copolymerize with ethylene. Also from the viewpoint of transparency and flexibility, preferred is use of an ethylene-α-olefin random copolymer. One alone or two or more different types of α-olefins to copolymerize with ethylene may be used here either singly or as combined.

Not specifically defined, the content of the α-olefin to copolymerize with ethylene is generally 2 mol % or more and preferably 40 mol % or less, relative to the entire monomer unit in the ethylene-α-olefin copolymer, and is more preferably from 3 to 30 mol %, even more preferably from 5 to 25 mol %. Falling within the range is preferred, since the copolymerization component can reduce the crystallinity of the copolymer to thereby improve the transparency thereof, and since there hardly occur troubles such as blocking of raw material pellets, etc. The type and the content of the monomer to copolymerize with ethylene may be analyzed according to any known method, for example, through qualitative and quantitative analysis with a nuclear magnetic resonance (NMR) apparatus or any other instrumental analyzer.

The ethylene-α-olefin copolymer may contain a monomer unit based on any other monomer than α-olefins. The monomer includes, for example, cyclic olefins, vinyl-aromatic compounds (styrene, etc.), polyene compounds, etc. The content of the monomer units is preferably 20 mol % or less based on all the monomer units, 100 mol % in the ethylene-α-olefin copolymer, more preferably 15 mol % or less.

The configuration, the branched structure, the branching degree distribution, the molecular weight distribution and the copolymerization mode (random, block, etc.) of the ethylene-α-olefin copolymer are not specifically defined. For example, a copolymer having long-chain branches could generally have good mechanical properties and have advantages in that its melt tension in forming the resin layer (S) is high and the calendering moldability thereof is good.

Not specifically defined, the melt flow rate (MFR) of the ethylene-α-olefin copolymer for use in the present invention is generally from 0.5 to 100 g/10 min or so as MFR thereof (JIS K7210, temperature: 190° C., load: 21.18 N), more preferably from 1 to 50 g/10 min, even more preferably from 2 to 50 g/10 min, still more preferably from 3 to 30 g/10 min.

In this, MFR may be selected in consideration of the formability and the workability in forming the resin layer (S), the adhesiveness and the spreadability in encapsulating solar cell devices (simply referred to as cells), etc. For example, when the resin layer (S) is formed through calender-molding, MFR of the copolymer to be used is preferably a relatively low value, concretely from 0.5 to 5 g/10 min or so in view of the handleability in peeling the resin layer(S) from molding rolls; but when the layer is formed through extrusion using a T-die, MFR of the copolymer is preferably from 1 to 50 g/10 min, more preferably from 2 to 50 g/10 min, even more preferably from 3 to 30 g/10 min, from the viewpoint of reducing the extrusion load and increasing the extrusion output. Further, from the viewpoint of the adhesiveness and the spreadability in encapsulating solar cell devices (simply referred to as cells), MFR of the copolymer to be used is preferably from 2 to 50 g/10 min, more preferably from 3 to 30 g/10 min.

The production method for the ethylene-α-olefin copolymer for use in the present invention is not specifically defined, for which is employable any known polymerization method using a known olefin polymerization catalyst. For example, there are mentioned a slurry polymerization method, a solution polymerization method, a vapor-phase polymerization method or the like using a multi-site catalyst such as typically a Ziegler-Natta catalyst, or a single-site catalyst such as typically a metallocene catalyst or a post-metallocene catalyst, and a bulk polymerization method using a radical initiator, etc. In the present invention, from the viewpoint of attaining easy granulation (pelletization) after polymerization and from the viewpoint of preventing the raw material pellets from blocking together, preferred is a polymerization method using a single-site catalyst, in which a raw material can be polymerized to give a polymer having few low-molecular-weight components and having a narrow molecular weight distribution.

The heat of crystal fusion of the ethylene-α-olefin copolymer for use in the present invention, as measured at a heating rate of 10° C./min in differential scanning calorimetry, is preferably from 0 to 70 J/g. Falling within the range, the copolymer is preferred as capable of securing the softness and the transparency (total light transmission) of the resin layer (S) to be formed. In view of the fact that raw material pellets may readily block together at high temperatures in summer, the heat of crystal fusion of the copolymer is preferably from 5 to 70 J/g, more preferably from 10 to 65 J/g.

The heat of crystal fusion may be measured at a heating rate of 10° C./min, using a differential scanning calorimeter and according to JIS K7122.

Specific examples of the ethylene-α-olefin copolymer for use in the present invention include Dow Chemical's trade names "Engage", "Affinity" and "Infuse", Exxon Mobile's trade name, "Exact", Mitsui Chemical's trade names "TAFMER H", "TAFMER A" and TAFMER P", LG Chemical's trade name "LUCENE", Japan Polyethylene's trade name "Karnel", etc.

Olefine-Based Resin (B)

The olefine-based resin (B) is a copolymer of propylene and any other monomer copolymerizable with propylene, or a propylene homopolymer. These are not specifically defined in point of the copolymerization mode (random, block, etc.), the branching, the branching distribution and the configuration thereof. These may be any of an isotactic, atactic or syndiotactic structure polymer or a polymer with a mixed structure thereof.

The other monomer copolymerizable with propylene includes ethylene, α-olefins having from 4 to 12 carbon atoms such as 1-butene, 1-hexene, 4-methyl-pentene-1,1-octene, etc.; dienes such as divinylbenzene, 1,4-cyclohexadiene, dicyclopentadiene, cyclo-octadiene, ethylidene-norbornene, etc.

In the present invention, from the viewpoint of the industrial availability, various special properties and the economic potential thereof, ethylene and 1-butene are preferably used for the α-olefin to copolymerize with propylene. From the viewpoint of transparency and softness thereof, preferably used here is a propylene-α-olefin random copolymer. One alone or two or more different types of monomers to copolymerize with propylene may be used here either singly or as combined.

The content of the other monomer copolymerizable with propylene is not specifically defined. In general, the content is 2 mol % or more relative to the total monomer units in the olefine-based resin (B), and preferably 40 mol % or less, more preferably from 3 to 30 mol %, even more preferably from 5 to 25 mol %. Falling within the range, the comonomer may reduce the crystallinity of the copolymer and may therefore enhance the transparency thereof; and another advantage thereof is that the raw material pellets hardly block together. The type and the content of the monomer capable of copolymerizing with propylene may be determined in any known method, for example, through qualitative and quantitative analysis using a nuclear magnetic resonance (NMR) apparatus or any other analyzer.

Not specifically defined, the melt flow rate (MFR) of the olefine-based resin (B) for use in the present invention is generally from 0.5 to 100 g/10 min or so as MFR thereof (JIS K7210, temperature: 230° C., load: 21.18 N), more preferably from 2 to 50 g/10 min, even more preferably from 3 to 30 g/10 min.

In this, MFR may be selected in consideration of the formability and the workability in forming the resin layer (S), the adhesiveness and the spreadability in encapsulating solar cell devices (simply referred to as cells), etc. For example, when the resin layer (S) is formed through calender-molding, MFR of the polymer to be used is preferably a relatively low value, concretely from 0.5 to 5 g/10 min or so in view of the handleability in peeling the resin layer (s) from molding rolls; but when the layer is formed through extrusion using a T-die, MFR of the polymer is preferably from 2 to 50 g/10 min, more preferably from 3 to 30 g/10 min from the viewpoint of reducing the extrusion load and increasing the extrusion output. Further, from the viewpoint of the adhesiveness and the spreadability in encapsulating solar cell devices (simply referred to as cells), MFR of the polymer to be used is preferably from 2 to 50 g/10 min, more preferably from 3 to 30 g/10 min.

The production method for the olefine-based resin (B) for use in the present invention is not specifically defined, for which is employable any known polymerization method using a known olefin polymerization catalyst. For example, there are mentioned a slurry polymerization method, a solution polymerization method, a vapor-phase polymerization method or the like using a multi-site catalyst such as typically a Ziegler-Natta catalyst, or a single-site catalyst such as typically a metallocene catalyst or a post-metallocene catalyst, and a bulk polymerization method using a radical initiator, etc. In the present invention, from the viewpoint of attaining easy granulation (pelletization) after polymerization and from the viewpoint of preventing the raw material pellets from blocking together, preferred is a polymerization method using a single-site catalyst, in which a raw material can be polymerized to give a polymer having few low-molecular-weight components and having a narrow molecular weight distribution.

Specific examples of the olefine-based resin (B) for use in the present invention include propylene/butene random copolymers, propylene/ethylene random copolymers, propylene/ethylene/butene-1 copolymers, etc.; and as commercial products, there are mentioned Mitsui Chemical's trade name "TAFMER XM" and "NOTIO", Sumitomo Chemical's trade name, "TAFFCELLEN", Prime Polymer's trade name "PRIME TPO", Dow Chemical's trade name "VERSIFY", Exxon Mobile's trade name "VISTAMAXX", etc.

Olefine-Based Resin (C)

The olefine-based resin (C) is a metal salt of a copolymer of an α-olefin such as ethylene, propylene or the like, and an aliphatic unsaturated carboxylic acid (in which the metal is preferably Zn, Na, K, Li, Mg or the like).

As commercial products, there are mentioned Mitsui Chemical's trade name "HIMILAN", Dow Chemical's trade name "AMPLIFY IO", etc.

Olefine-Based Resin (D)

The olefine-based resin (D) is an ethylenic copolymer containing ethylene and at least one monomer selected from aliphatic unsaturated carboxylic acids and aliphatic unsaturated monocarboxylic acid alkyl esters.

Concretely, there are mentioned ethylene-acrylic acid copolymers, ethylene-methacrylic acid copolymers, ethylene-acrylate copolymers, ethylene-methacrylate copolymers, etc. Here, the ester moiety includes an alkyl ester having from 1 to 8 carbon atoms such as methyl, ethyl, propyl, butyl etc. In the present invention, the copolymer may also be a ternary or more polynary copolymers with any third component added thereto (for example, ternary or more polynary copolymer suitably selected from ethylene, aliphatic unsaturated carboxylic acids and esters of aliphatic unsaturated carboxylic acids and the like). The content of the monomer to copolymerize with ethylene may be generally from 5 to 35% by weight relative to all the monomer units in the copolymer.

The special properties that are generally required for encapsulant sheets include softness and impact resistance for protecting solar cell devices, heat resistance for protecting solar cell modules in heat generation, transparency (whole light transmittance, etc.) for efficient arrival of sunlight to solar cell devices, adhesiveness to various adherends (glass, back sheet, etc.), durability, dimensional stability, flame retardation, water vapor barrier performance, economic potential, etc. Above all, the balance between softness, heat resistance and transparency and the economic potential are considered especially important.

Here, when specific attention is paid to the softness of the encapsulant sheet, it is desirable that the crystal melting peak temperature (Tm) of the olefine-based resin that is the main ingredient in the resin composition to form the resin layer(S) is lower than 100° C.; however, a polymer not expressing any crystal melting peak temperature, or that is an amorphous polymer is usable here (hereinafter the polymer including such an amorphous polymer is referred to as an olefinic polymer having a crystal melting peak temperature of lower than 100° C.). In consideration of blocking of raw material pellets, the crystal melting peak temperature is preferably from 30 to 95° C., more preferably from 45 to 80° C., even more preferably from 60 to 80° C.

When special attention is paid to the heat resistance of the encapsulant sheet, it is desirable that the resin composition containing a olefine-based resin, of which the crystal melting peak temperature (Tm) is lower than 100° C., further contains an olefine-based resin of which the crystal melting peak temperature (Tm) is 100° C. or higher, as mixed therein. The upper limit of the crystal melting peak temperature (Tm) of the additional olefine-based resin to be mixed is not specifically defined. In consideration of the thermal degradation of solar cell devices (simply referred to as cells) and the lamination temperature to be set in production of solar cell modules, the upper limit could be 150° C. or so. For lowering the lamination temperature to be set in production of solar cell modules and for preventing thermal degradation of solar cell devices (simply referred to as cells), the temperature is preferably 130° C. or lower, more preferably 125° C. or lower.

Here, some reference data of the crystal melting peak temperature are shown here. Ordinary high-density polyethylene (HDPE) has from 130 to 145° C. or so; low-density polyethylene resin (LDPE) has from 100 to 125° C. or so; ordinary homopolypropylene resin has 165° C. or so; ordinary propylene-ethylene random copolymer has from 130 to 150° C. or so. The crystal melting peak temperature may be measured at a heating rate of 10° C./min, using a differential scanning calorimeter and according to JIS K7121.

Preferably, as described above, the resin layer (S) in the present invention is formed of a resin composition containing an olefine-based resin of which the crystal melting peak temperature is lower than 100° C. and an olefine-based resin of which the crystal melting peak temperature is 100° C. or higher.

The content of each of the two olefine-based resins in the resin composition is not specifically defined, but in consideration of the flexibility, the heat resistance, the transparency and the like of the resin layer (S) to be formed, the blend (content) ratio by mass of the two olefine-based resins (olefine-based resin of which the crystal melting peak temperature is lower than 100° C./olefine-based resin of which the crystal melting peak temperature is 100° C. or higher) is preferably (99 to 50)/(1 to 50), more preferably (98 to 60)/(2 to 40), even more preferably (97 to 70)/(3 to 30), still more preferably (97 to 80)/(3 to 20), further more preferably (97 to 90)/(3 to 10). Here, the total of the two olefine-based resins is 100 parts by mass. The blend (content) ratio by mass falling within the above range is preferred as facilitating the formation of the resin layer (S) excellent in flexibility, heat resistance, transparency, etc.

In the present invention, the resin composition to form the resin layer (S) may contain any other resin than the above-mentioned olefine-based resin so far as the composition contains the olefine-based resin as the main ingredient therein.

In the present specification, "the main ingredient" means the ingredient that accounts for 50% by mass or more of all the constituent ingredients in the resin composition, preferably 65% by mass or more, more preferably 80% by mass or more and 100% by mass or less, though the expression does not define any concrete content.

Here, the olefine-based resin of which the crystal melting peak temperature is 100° C. or higher and which may be mixed in the resin layer (S) may be suitably selected in consideration of the desired properties thereof, but in the present invention, an ethylene-α-olefin block copolymer is most favorably used as excellent in well-balanced heat resistance, flexibility and low-temperature properties.

<Ethylene-α-Olefin Block Copolymer>

The block structure of the ethylene-α-olefin block copolymer is not specifically defined, but preferred is a multi-block structure containing two or more segments or blocks differing from each other in point of the comonomer content, the crystallinity, the density, the crystal melting peak temperature (Tm) or the glass transition temperature (Tg) thereof, from the viewpoint of attaining well-balanced softness, heat resistance, transparency and others. Concretely, there are mentioned a completely symmetric block structure, an asymmetric block structure, a tapered block structure (in which the proportion of the block structures gradually increase in the main chain), etc. Regarding the configuration of the copolymer having the multi-block structure and the production method for the copolymer, those described in detail in WO2005/090425, WO2005/090426, WO2005/090427 and others may be hereby incorporated by reference.

Next described in detail is the above-mentioned ethylene-α-olefin block copolymer having a multi-block structure.

The ethylene-α-olefin block copolymer having a multi-block structure is favorably used in the present invention, and preferred is an ethylene-octene multi-block copolymer in which 1-octene is the comonomer, α-olefin. The block copolymer is preferably a multi-block copolymer that contains two or more, nearly amorphous soft segments in which the proportion of the copolymerized octene component is large (about 15 to 20 mol %) relative to ethylene, and two or more, high-crystalline hard segments in which the proportion of the copolymerized octene component is small (less than about 2 mol %) relative to ethylene and which have a crystal melting peak temperature of from 110 to 145° C. By suitably controlling the chain length and the proportion of these soft segments and hard segments therein, the block copolymer can be made to satisfy both softness and heat resistance.

Specific examples of the multi-block structure-having copolymer include Dow Chemical's trade name "Infuse".

If desired, various types of additives may be added to the resin composition constituting the resin layer (S). The additives include, for example, a silane coupling agent, an antioxidant, a UV absorbent, a weather-resistant stabilizer, a light diffusing agent, a nucleating agent, a pigment (e.g., white pigment), a flame retardant, a discoloration inhibitor, etc. In the present invention, preferred is adding at least one additive selected from a silane coupling agent, an antioxidant, a UV absorbent and a weather-resistant stabilizer for the reasons mentioned below. In the present invention, it is unnecessary to add a crosslinking agent and a crosslinking promoter to the resin composition; however, the invention does not exclude the addition, and, for example, in case where high-level heat resistance is desired for the encapsulant material, a crosslinking agent and/or a crosslinking promoter may be added to the composition in such an amount not to cause some trouble such as air staying.

The silane coupling agent is effective for enhancing the adhesiveness of the encapsulant sheet to a protective material (front sheet, back sheet and others made of glass or resin) and to solar cell devices and others; and as its examples, there are mentioned compounds having an unsaturated group such as a vinyl group, an acryloxy group or a methacryloxy group, as well as an amino group, an epoxy group or the like, and additionally having a hydrolysable group such as an alkoxy group. Specific examples of the silane coupling agent include N-(β-aminoethyl)-γ-aminopropyltrimethoxysilane, N-(β-aminoethyl)-γ-aminopropylmethyldimethoxysilane, γ-aminopropyltriethoxysilane, γ-glycidoxypropyltrimethoxysilane, γ-methacryloxypropyltrimethoxysilane, etc. In the present invention, preferred is use of γ-glycidoxypropyltrimethoxysilane or γ-methacryloxypropyltrimethoxysilane as securing good adhesiveness and causing little discoloration such as yellowing. One alone or two or more different types of these silane coupling agents may be used here either singly or as combined.

The amount of the silane coupling agent to be added is generally from 0.1 to 5 parts by mass or so, relative to 100 parts by mass of the resin composition, preferably from 0.2 to 3 parts by mass. Like the silane coupling agent, any other coupling agent such as an organic titanate compound or the like may also be used effectively here.

Various commercial products are usable here as the antioxidant. There are mentioned various types antioxidants such as monophenol-type, bisphenol-type, polymeric phenol-type, sulfur-containing and phosphite-type antioxidants, etc.

The monophenol-type antioxidants include, for example, 2,6-di-tert-butyl-p-cresol, butylated hydroxyanisole, 2,6-di-tert-butyl-4-ethylphenol, etc. The bisphenol-type antioxidants include 2,2'-methylenebis(4-methyl-6-tert-butylphenol), 2,2'-methylenebis(4-ethyl-6-tert-butylphenol), 4,4'-thiobis(3-methyl-6-tert-butylphenol), 4,4'-butylidenebis(3-methyl-6-tert-butylphenol), 3,9-bis[{1,1-dimethyl-2-{β-(3-tert-butyl-4-hydroxy-5-methylphenyl)propionyloxy}ethyl}2,4,9,10-tetroxaspiro]-5,5-undecane, etc.

The polymeric phenol-type antioxidants include 1,1,3-tris (2-methyl-4-hydroxy-5-tert-butylphenyl)butane, 1,3,5-trimethyl-2,4,6-tris(3,5-di-tert-butyl-4-hydroxybenzyl)benzene, tetrakis-{methylene-3-(3',5'-di-tert-butyl-4'-hydroxyphenyl)propionate}methane, bis{(3,3'-bis-4'-hydroxy-3'-tert-butylphenyl)butyric acid}glucose ester, 1,3,5-tris(3',5'-di-tert-butyl-4'-hydroxybenzyl)-s-triazine-2,4,6-(1H,3H,5H)trione, tocopherol (vitamin E), etc.

The sulfur-containing antioxidants include dilauroyl thiodipropionate, dimyristyl thiodipropionate, distearyl thiopropionate, etc.

The phosphite-type antioxidants include triphenyl phosphite, diphenylisodecyl phosphite, phenyldiisodecyl phosphite, 4,4'-butylidene-bis(3-methyl-6-tert-butylphenyl-di-tridecyl)phosphite, cyclic neopentane-tetrayl bis(octadecyl phosphite), tris(mono and/or di)phenyl phosphite, diisodecyl pentaerythritol diphosphite, 9,10-dihydro-9-oxa-10-phosphaphenanthrene-10-oxide, 10-(3,5-di-tert-butyl-4-hydroxybenzyl)-9,10-dihydro-9-oxa-10-phosphaphenanthrene-10-oxide, 10-decyloxy-9,10-dihydro-9-oxa-10-phosphaphenanthrene, cyclic neopentane-tetrayl bis(2,4-di-tert-butylphenyl)phosphite, cyclic neopentane-tetrayl bis(2,6-di-tert-methylphenyl)phosphite, 2,2-methylenebis(4,6-tert-butylphenyl)octyl phosphite, etc.

One alone or two or more different types of the above antioxidants may be used here either singly or as combined.

In the present invention, preferably used are phenol-type and phosphite-type antioxidants from the viewpoint of the effect, the thermal stability and the economic potential thereof, and more preferably the two different types of antioxidants are combined for use herein.

The amount of the antioxidant to be added is generally from 0.1 to 1 part by mass or so, relative to 100 parts by mass of the resin composition, but preferably from 0.2 to 0.5 parts by mass.

Various commercial products are usable here as the UV absorbent, including various types of benzophenone-type, benzotriazole-type, triazine-type or salicylate-type UV absorbents and others.

The benzophenone-type UV absorbents include, for example, 2-hydroxy-4-methoxybenzophenone, 2-hydroxy-4-methoxy-2'-carboxybenzophenone, 2-hydroxy-4-octoxybenzophenone, 2-hydroxy-4-n-dodecyloxybenzophenone, 2-hydroxy-4-n-octadecyloxybenzophenone, 2-hydroxy-4-benzyloxybenzophenone, 2-hydroxy-4-methoxy-5-sulfobenzophenone, 2-hydroxy-5-chlorobenzophenone, 2,4-dihydroxybenzophenone, 2,2'-dihydroxy-4-methoxybenzophenone, 2,2'-dihydroxy-4,4'-dimethoxybenzophenone, 2,2',4,4'-tetrahydroxybenzophenone, etc.

The benzotriazole-type UV absorbents include hydroxyphenyl-substituted benzotriazole compounds, for example, 2-(2-hydroxy-5-methylphenyl)benzotriazole, 2-(2-hydroxy-5-t-butylphenyl)benzotriazole, 2-(2-hydroxy-3,5-dimethylphenyl)benzotriazole, 2-(2-methyl-4-hydroxyphenyl)benzotriazole, 2-(2-hydroxy-3-methyl-5-t-butylphenyl)benzotriazole, 2-(2-hydroxy-3,5-di-t-amylphenyl)benzotriazole, 2-(2-hydroxy-3,5-di-t-butylphenyl)benzotriazole, etc. The triazine-type UV absorbents include 2-[4,6-bis(2,4-dimethylphenyl)-1,3,5-triazin-2-yl]-5-(octyloxy)phenol, 2-(4,6-diphenyl-1,3,5-triazin-2-yl)-5-(hexyloxy)phenol, etc. The salicylate-type UV absorbents include phenyl salicylate, p-octylphenyl salicylate, etc.

One alone or two or more different types of the UV absorbents may be used either singly or as combined.

The amount of the UV absorbent to be added is generally from 0.01 to 2.0 parts by mass or so, relative to 100 parts by mass of the resin composition, but preferably from 0.05 to 0.5 parts by mass.

As the weather-resistant stabilizer for imparting weather resistance apart from the above-mentioned UV absorbent, preferred is use of hindered amine-type light stabilizers. The hindered amine-type light stabilizer does not absorb UV rays, different from UV absorbents, but when combined with a UV-absorbent, it exhibits a noticeable synergistic effect. Some others than hindered amine-type compounds may function as a light stabilizer, but many of such compounds are colored and are therefore unfavorable for use in the solar cell encapsulant material of the present invention.

The hindered amine-type light stabilizer includes dimethyl succinate-1-(2-hydroxyethyl)-4-hydroxy-2,2,6,6-tetramethyl piperidine polycondensate, poly[{6-(1,1,3,3-tetramethylbutyl)amino-1,3,5-triazine-2,4-diyl}{(2,2,6,6-tetramethyl-4-piperidyl)imino}hexamethylene{{2,2,6,6-tetramethyl-4-piperidyl}imino}], N,N'-bis(3-aminopropyl)ethylenediamine-2,4-bis[N-butyl-N-(1,2,2,6,6-pentamethyl-4-piperidyl)amino]-6-chloro-1,3,5-triazine condensate, bis(2,2,6,6-tetramethyl-4-piperidyl) sebacate, bis(1,2,2,6,6-pentamethyl-4-piperidyl) 2-(3,5-di-tert-4-hydroxybenzyl)-2-n-butylmalonate, etc. The amount of the hindered amine-type light stabilizer to be added is generally from 0.01 to 0.5 parts by mass or so, relative to 100 parts by mass of the resin composition, but is preferably from 0.05 to 0.3 parts by mass.

In the solar cell encapsulant sheet of the present invention, it is important that at least one surface of the resin layer (S) is the sheet surface of the encapsulant sheet and that the sheet surface satisfies the following requirements (a), (b) and (c), from the viewpoint of preventing blocking and preventing wrinkling and air staying in a process of producing solar cell modules:

(a) the dynamic friction coefficient on a tempered white glass plate is 1.5 or less, (b) the surface roughness Rzjis is from 0.1 to 50 μm, and (c) The static friction coefficient on a tempered white glass plate is 1.5 or less.

In a process of producing solar cell modules, an operation is needed of slipping the encapsulant sheet for position control in overlaying the encapsulant sheet. When the dynamic friction coefficient on a tempered white glass plate of the sheet surface of the encapsulant sheet that comprises the resin layer (S) of the solar cell encapsulant sheet of the present invention (hereinafter the sheet surface may be referred to as (S) sheet surface) is 1.5 or less, then the above operation can be carried out with no trouble. From the above-mentioned viewpoint, the dynamic friction coefficient is preferably 1.2 or less, more preferably 1.0 or less. In the step of stacking the members in solar cell module production, the dynamic friction coefficient is preferably 0.3 or more, more preferably 0.5 or more, from the viewpoint of preventing the encapsulant sheet itself from slipping away with ease.

The dynamic friction coefficient can be controlled by the emboss profile and the emboss depth of the (S) sheet surface, and giving embossed projections to the (S) sheet surface is effective for reducing the dynamic friction coefficient.

In case where the surface roughness Rzjis of the (S) sheet surface of the solar cell encapsulant sheet of the present invention is from 0.1 to 50 μm, it is easy to unwind the rolled sheet, and in a process of stacking the constituent members in solar cell module production, it is easy to arrange the encapsulant sheet in a prescribed position. The surface roughness Rzjis is preferably 5 μm or more, more preferably 10 μm or more, from the viewpoint of preventing the encapsulant sheets from blocking together. Also from the viewpoint of securing the slippability of the encapsulant sheet, the surface roughness is preferably 40 μm or less, more preferably 35 μm or less.

The surface roughness Ra of the (S) sheet surface of the solar cell encapsulant sheet of the present invention is not specifically defined but is, for the same reason as above, preferably from 0.5 to 5 μm, more preferably from 1 to 4 μm.

The surface roughness Rzjis means a ten point average roughness and Ra means an arithmetic average roughness, as concretely measured according to the methods described in the section of Examples.

The surface roughness Rzjis and the surface roughness Ra can be controlled by making the roll surface in sheet formation have a desired profile, or that is, by controlling the emboss profile and the emboss depth of the (S) sheet surface.

When the static friction coefficient on a tempered white glass plate of the (S) sheet surface of the solar cell encapsulant sheet of the present invention is 1.5 or less, then the operation of slipping the encapsulant sheet itself for positioning thereof in arranging the encapsulant sheet can be attained with no trouble. From the above viewpoint, the static friction coefficient is preferably 1.2 or less, more preferably 1.0 or less. In general, there may exist a relationship to satisfy "static friction coefficient>dynamic friction coefficient"; however, when the encapsulant sheet is a soft material, it would not satisfy the above relationship depending on the additive contained therein and on the emboss profile of the sheet. From the viewpoint that the encapsulant sheet could not readily slip off in a process of stacking the constituent members in solar cell module production, the static friction coefficient is preferably 0.3 or more, more preferably 0.5 or more.

Like the above-mentioned dynamic friction coefficient, the static friction coefficient can also be controlled by the emboss profile and the emboss depth of the (S) sheet surface.

Not specifically defined, the emboss profile may be any one satisfying the above-mentioned requirements (a), (b) and (c). For example, there are mentioned fine patterns such as stripe, grain, pearskin finish, skin print, diamond lattice, synthetic leather-like grain pattern, etc.; as well as pyramids, cones, planar star shapes, etc. However, in a periodical profile, the area where projections and recesses overlap with each other would be more hardly slippable, and therefore, a non-periodic emboss profile is preferred here. "Non-periodic emboss" means an emboss profile where ones that are the same in point of the emboss profile (pyramidal, conical, etc.), the emboss-to-emboss distance, the emboss depth and others are not arranged regularly. The emboss depth is preferably from 0.1 to 100 µm in view of the easiness in sheet working.

As a method for embossing the (S) sheet surface, herein employable is a method of thermal compression bonding that uses an embossed metal roll in forming the encapsulant sheet, or thermal compression bonding that uses a sand-silicone rubber roll, or thermal compression bonding that uses both the two; or a method of transferring an emboss pattern to the sheet by laminating a sheet, paper or the like given an emboss profile on the surface thereof together simultaneously with sheet formation.

In the solar cell encapsulant sheet of the present invention, the (S) sheet surface alone may be embossed, but from the viewpoint of preventing blocking in roll formation and from the viewpoint of preventing wrinkling and air staying in a process of solar cell module production, it is desirable that both surfaces of the encapsulant sheet are embossed.

The solar cell encapsulant sheet of the present invention may be a single-layer sheet of the resin layer (S) alone that is formed of a resin composition containing an olefine-based resin, or may also be a laminate that includes the resin layer (S) and any other layer than the resin layer (S) (hereinafter the additional layer may be referred to as "resin layer (T)").

In case where the solar cell encapsulant sheet of the present invention includes a laminate of at least two layers, having the resin layer (S) and the resin layer (T), the resin layer (T) is laminated on the surface different from the above-mentioned (S) sheet surface so that the surface satisfying the above-mentioned requirements (a) to (c) that are the characteristic features in the present invention could be the surface of the sheet. With that, the present invention exhibits the advantageous effects thereof capable of preventing wrinkling and air staying in a process of solar cell module production.

Not specifically defined, the resin to form the resin layer (T) may be any resin capable of being used for encapsulant sheets. From the viewpoint of easy regeneration and addition in production of the solar cell encapsulant sheet of the present invention and improvement in the productivity such as product yield and others owing to the easiness, and further from the viewpoint of the interlayer adhesiveness to the resin layer (S) as well as the softness, the heat resistance and the transparency thereof, the resin is preferably any of the olefine-based resin of the above-mentioned (A) to (D), and is more preferably the same resin as that of the resin layer (S). The "same resin as that of the resin layer (S)" as referred to herein means that, for example, when the resin to form the resin layer (S) is the above-mentioned olefine-based resin (A), the resin to form the resin layer (T) is also a resin that is grouped in the category of the above-mentioned olefine-based resin (A). However, the resin layer (T) differs from the resin layer (S) in point of the physical properties thereof. In other words, the resin layer (T) is not needed to satisfy the above-mentioned requirements (a) to (c).

In case where the solar cell encapsulant sheet of the present invention is a laminate, the laminate configuration is not specifically defined. For example, there may be mentioned a two-type two-layer configuration having the resin layer (S) and the resin layer (T), and a two-type three-layer configuration having the resin layer (S), the resin layer (T) and the resin layer (S) as laminated in that order. In the present invention, from the viewpoint of preventing blocking and preventing wrinkling and air staying in a process of solar cell module production, preferred is the two-type three-layer configuration having the resin layer (S) as both outermost layers thereof.

In the case of the laminate, the thickness ratio of the resin layer (S) to the resin layer (T) is not specifically defined, but from the viewpoint of preventing blocking and preventing wrinkling and air staying in a process of solar cell module production, the thickness ratio [resin layer (S)/resin layer (T)] preferably falls within a range of from 1/1 to 1/9, more preferably from 4/6 to 1/9. In case where the laminate has two or more resin layers (S) and two or more resin layers (T), the thickness ratio of the resin layer (S) to the resin layer (T) means the ratio of the total thickness of the resin layers (S) to the total thickness of the resin layers (T).

Next described is a production method for the solar cell encapsulant sheet of the present invention.

As the production method for the encapsulant sheet, herein employable is a known method, for example, an extrusion casting method, a calendering method, an inflation method or the like equipped with a melt mixing apparatus such as using a single-screw extruder, a multi-screw extruder, a Banbury mixer, a kneader or the like and using a T-die. Though not specifically defined, in the present invention, preferred is an extrusion casting method using a T-die, from the viewpoint of the handleability and the productivity. In case where the encapsulant sheet is a laminate, the laminate sheet can be produced by co-extrusion casting through a multilayer T-die using multiple extruders. The molding temperature in the extrusion casting method using a T-die may be suitably controlled depending on the flow properties and the film formability of the resin composition to be used, but may be generally from 130 to 300° C., preferably from 150 to 250° C. Further, the surface and/or the back of the encapsulant sheet is embossed in the manner as mentioned above.

Not specifically defined, the thickness of the encapsulant sheet is generally 0.03 mm or more, preferably 0.05 mm or more, more preferably 0.1 mm or more, and is generally 1 mm or less, preferably 0.7 mm or less, more preferably 0.5 mm or less.

Various additives such as a silane coupling agent, an antioxidant, a UV absorbent, a weather-resistant stabilizer and the like may be dry-blended with resin and then fed into a hopper; or all the materials may be previously melt-mixed and pelletized, and then the pellets may be fed thereinto; or a master batch in which the additives alone are previously concentrated in resin may be prepared and fed into the production line.

For the purpose of enhancing the adhesiveness to various adherends, the sheet may be surface-treated variously by corona treatment, plasma treatment, primer treatment, etc. Here, the target of the surface treatment is preferably 50 mN/m as the wetting index, more preferably 52 mN/m or more. The upper limit of the wetting index is generally 70 mN/m or so.

<Solar Cell Encapsulant Sheet Roll>

The solar cell encapsulant sheet roll of the present invention is a solar cell encapsulant sheet roll produced by rolling up the above-mentioned solar cell encapsulant sheet.

Not specifically defined, the encapsulant sheet that has been rolled up to be an encapsulant sheet roll preferably has a width of from 500 to 1700 mm and a length of from 50 to 1000 m.

The rolling method to give the encapsulant sheet roll is not specifically defined, for which, for example, employable is a method of rolling up the sheet under a rolling-up tension of 5 kgf or less given to the entire width of the encapsulant sheet, preferably 3 kgf or less, more preferably 2 kgf or less. It is important that the encapsulant sheet roll is not loosened to deviate in rolling up the sheet, and therefore, the rolling-up tension is preferably 0.5 kgf or more, more preferably 1 kgf or more.

<Solar Cell Module>

The solar cell module produced by the use of the solar cell encapsulant sheet of the present invention is not almost troubled by wrinkling or air staying and is therefore excellent in quality.

Here are exemplified various types of solar cell modules, concretely including a configuration of upper protective material (front sheet)/encapsulant sheet of the present invention/solar cell device/encapsulant sheet of the present invention/lower protective material (back sheet); a configuration in which the encapsulant sheet of the present invention and an upper protective materials are formed on a solar cell device formed on the inner peripheral surface of a lower protective material; a configuration in which the encapsulant sheet of the present invention and a lower protective material are formed on a solar cell device formed on the inner peripheral surface of an upper protective material, for example, on an amorphous solar cell device formed on a fluororesin protective material by sputtering or the like.

In the present specification, for example, the expression of A/B/C means that A, B and C are laminated in that order from the top (or from the bottom).

As the solar cell device, for example, there are mentioned single-crystal silicon-type, polycrystal silicon-type, amorphous silicon-type, gallium-arsenic, copper-indium-selenium, cadmium-tellurium or the like III-V group or II-VI group compound semiconductor-based, dye-sensitized type, organic thin film-type or the like solar cell devices.

The members to constitute the solar cell module are not specifically defined. The upper protective material may be a single-layer or multilayer sheet of inorganic materials or various types of thermoplastic resin films, etc., for which, for example, there are mentioned single-layer or multilayer protective materials of inorganic materials such as glass or the like as well as thermoplastic resins such as polyesters, inorganic substance-deposited polyesters, fluororesins, polyolefins, etc. The lower protective material may be a single-layer or multilayer sheet of metals, inorganic materials, various types of thermoplastic resin films or the like, for which, for example, there are mentioned metals single-layer or multilayer protective materials of metals such as tin, aluminium, stainless or the like, inorganic materials such as glass or the like, or thermoplastic resins such as polyesters, inorganic substance-deposited polyesters, fluororesins, polyolefins, etc. The surface of the upper and/or lower protective material may be surface-treated in any known manner for primer treatment, corona treatment or the like for the purpose of enhancing the adhesiveness between the encapsulant sheet and other members.

One example of the solar cell module produced by the use of the encapsulant sheet of the present invention, having a configuration of upper protective material (front sheet)/encapsulant sheet/solar cell device/encapsulant sheet/lower protective material (back sheet) as described above, is described below. A front sheet, an encapsulant sheet of the present invention, a solar cell device, an encapsulant sheet of the present invention and a back sheet are laminated in that order from the side of receiving sunlight, and to the lower surface of the back sheet, adhered is a junction box (terminal box for connecting a wiring for taking out the generated electricity from the solar cell device). The solar cell device is connected by wiring for electrically leading the generated current to the outside. The wiring is taken to the outside via the through-hole formed in the back sheet, and is connected to the junction box.

As the production method for the solar cell module, employable is any known method with no specific limitation thereon. In general, the production method comprises a step of laminating the upper protective material, the encapsulant sheet of the present invention, the solar cell device, the encapsulant sheet of the present invention and the lower protective material in that order, and a step of bonding them under heat and pressure through vacuum suction. A batch-type production line, or a roll-to-roll type production line is applicable to the method.

The solar cell module of the present invention may be produced through thermal compression of bonding under pressure the upper protective material, the encapsulant sheet of the present invention, the solar cell device, the encapsulant sheet of the present invention and the lower protective material according to an ordinary method and using a vacuum laminator, preferably at a temperature of from 130 to 180° C., more preferably from 130 to 150° C., for a degassing period of from 2 to 15 minutes, under a pressing pressure of from 0.5 to 1 atm, and a pressing time of preferably for from 8 to 45 minutes, more preferably from 10 to 40 minutes.

The solar cell module produced by the use of the encapsulant sheet of the present invention is usable in various applications irrespective of indoor use or outdoor use, for example, for small-size solar cells such as typically those in mobile instruments, as well as large-size solar cells to be installed on roofs or rooftop decks, depending on the type of the solar cell and the module form to be applied thereto.

EXAMPLES

The present invention is described in more detail with reference to the following Examples, however, the present invention is not limited at all by these Examples. The encapsulant sheets mentioned in the specification were analyzed for their data and evaluations, as mentioned below.

[Measurement of Physical Properties of Resin Layer (S)]

(Storage Elastic Modulus at 25° C.)

Using IT Measurement's viscoelasticity meter, trade name "Viscoelasticity Spectrometer DVA-200", a sample (4 mm in length, 60 mm in width) was analyzed in the lateral direction, at an oscillation frequency of 10 Hz, at a strain of 0.1%, at a heating rate of 3° C./min and at a chuck-to-chuck distance of 25 mm, in a range from −150° C. to 150° C., and from the acquired data, the storage elastic modulus (E') at 25° C. of the sample was obtained.

(Surface Roughness Rzjis)

The ten point average roughness Rzjis of the encapsulant sheet surface was measured according to the method of JIS-B0601 (2001).

(Surface Roughness Ra)

The arithmetic average roughness Ra of the encapsulant sheet surface was measured according to the method of JIS-B0601 (2001).

(Dynamic Friction Coefficient and Static Friction Coefficient)

A measuring apparatus conformable to JIS-K7125 was used. A sample was fixed on a sliding piece (63 mm in length, 63 mm in width, total mass of 200 g) with a double-stick tape, and the dynamic friction coefficient and the static friction coefficient of the encapsulant sheet surface of the sample were measured against a tempered white glass plate serving as the other plate.

[Evaluations]

(Blocking Resistance)

A solar cell encapsulant sheet having a length of 200 mm was rolled up around a roll core having a diameter of 7.5 cm to prepare an encapsulant sheet roll. The encapsulant sheet roll was unwound at a speed of 10 m/min and the condition of the thus-unwinded encapsulant sheet was visually checked, and the sheet was evaluated according to the following criteria.

A: The solar cell encapsulant sheet roll was smoothly unwinded with neither shrinkage in the width direction nor elongation in the length direction of the unwinded sheet.

B: Owing to blocking thereof, the solar cell encapsulant sheet roll was somewhat difficult to unwind, and the unwinded sheet was shrunk in the width direction and elongated in the length direction.

C: The solar cell encapsulant sheet roll was difficult to unwind.

(Air Staying in Pressing)

Multiple solar cell silicon semiconductor wafers connected via an interconnector were aligned, and a transparent glass plate was laminated on the top of the solar cell silicon semiconductor wafers via a solar cell encapsulant sheet put therebetween, and a solar cell back sheet was laminated on the back of the solar cell silicon semiconductor wafers via a solar cell encapsulant sheet put therebetween, thereby preparing a laminate.

Using a vacuum press, the laminate was hot-pressed to produce a laminated and integrated solar cell module. The solar cell module was checked for the presence or absence of air staying around the cells or around the interconnector therein, and evaluated according to the following criteria.

A: No air staying.

B: 10 or less bubbles having a major diameter of less than 2 mm stayed.

C: Bubbles having a major diameter of 2 mm or more formed.

Example 1

A resin composition prepared by blending 95 parts by mass of an ethylene-α-olefin random copolymer, ethylene-octene random copolymer (Dow Chemical's trade name: ENGAGE 8200, MFR: 5, octene content: 10.1 mol %) and 5 parts by mass of an ethylene-α-olefin block copolymer, ethylene-octene block copolymer (Dow Chemical's trade name: INFUSE D9100, MFR: 1, octene content: 12.8 mol %) was melt-kneaded with a 40-mmφ single-screw extruder equipped with a T-die at a preset temperature of 200° C., and then using a rubber roll having a surface roughness Rzjis of 40 μm, cast between the rubber roll and a cast roll at 20° C. for rapidly-cooling film formation, thereby giving an encapsulant sheet having a thickness of 0.5 mm and embossed on both surfaces thereof. Using the thus-obtained encapsulant sheet, a solar cell module was produced as described above. The evaluation results are shown in Table 1.

Example 2

A solar cell encapsulant sheet and a solar cell module were produced and evaluated in the same manner as in Example 1, except that the rubber roll having a surface roughness Rzjis of 40 μm in Example 1 was changed to a rubber roll having a surface roughness Rzjis of 15 μm.

Example 3

A solar cell encapsulant sheet and a solar cell module were produced and evaluated in the same manner as in Example 1, except that the resin composition in Example 1 was changed to a resin composition prepared by blending 90 parts by mass of LLDPE (Prime Polymer's trade name: EVOLUE P SP9048, MFR: 4) and 10 parts by mass of LLDPE (Prime Polymer's trade name: NEOZEX 0234N, MFR: 2).

Example 4

As the resin layer (S), used was an ethylene-α-olefin random copolymer, ethylene-octene random copolymer (Dow Chemical's trade name: ENGAGE 8200, MFR: 5, octene content: 10.1 mol %); and as the resin layer (T), used was the resin composition described in Example 1. The resins were melt-kneaded with a unidirectional double-screw extruder equipped with a lamination feed block and a T-die at a preset temperature of 200° C. to give a laminate of the resin layer (S), the resin layer (T) and the resin layer (S) as laminated in that order, and then using a rubber roll having a surface roughness Rzjis of 40 μm, cast between the rubber roll and a cast roll at 200° C. for rapidly-cooling film formation, thereby giving an encapsulant sheet of resin layer(S)/resin layer (T)/resin layer (S)=0.05 mm/0.40 mm/0.05 mm embossed on both surfaces thereof. Using the thus-obtained encapsulant sheet, a solar cell module was produced as described above. The evaluation results are shown in Table 1.

Comparative Example 1

A solar cell encapsulant sheet and a solar cell module were produced and evaluated in the same manner as in Example 1, except that the resin composition in Example 1 was changed to an ethylene-vinyl acetate copolymer (Mitsui DuPont Polychemical's trade name: EVAFLEX EV150, vinyl acetate content: 33 wt. %, MFR: 30).

Comparative Example 2

A solar cell encapsulant sheet and a solar cell module were produced and evaluated in the same manner as in Example 1, except that the resin composition in Example 1 was changed to an ethylene-vinyl acetate copolymer (Mitsui DuPont Polychemical's trade name: EVAFLEX EV250, vinyl acetate content: 28 wt. %, MFR: 15) and the rubber roll was changed to a different one having a surface roughness Rzjis of 350 μm.

Comparative Example 3

A solar cell encapsulant sheet and a solar cell module were produced and evaluated in the same manner as in Example 1, except that the rubber roll having a surface roughness Rzjis of 40 μm in Example 1 was changed to a rubber roll with three-sided pyramids regularly aligned on the surface thereof to have a surface roughness Rzjis of 40 μm (distance between three-sided pyramids 100 μm, depth of three-sided pyramids 40 μm).

Comparative Example 4

A solar cell encapsulant sheet and a solar cell module were produced and evaluated in the same manner as in Example 1, except that the resin composition in Example 1 was changed to an ethylene-methacrylic acid copolymer (Mitsui DuPont Polychemical's trade name: HIMILAN 1652, MFR: 5.5) and the rubber roll was changed to a different one having a surface roughness Rzjis of 15 μm.

TABLE 1

|  | Example | | | | Comparative Example | | | |
|---|---|---|---|---|---|---|---|---|
|  | 1 | 2 | 3 | 4 | 1 | 2 | 3 | 4 |
| Storage Elastic Modulus at room temperature (25° C.) [MPa] | 15 | 15 | 75 | 15 | 15 | 15 | 15 | 500 |
| Surface Roughness (Rzjis) [μm] | 35 | 10 | 35 | 35 | 35 | 300 | 35 | 10 |
| Surface Roughness (Ra) [μm] | 3.0 | 1.2 | 3.0 | 3.0 | 3.1 | 145.0 | 15.0 | 1.0 |
| Dynamic Friction Coefficient (against glass) | 0.5 | 0.5 | 0.4 | 0.5 | 2.6 | 1.5 | 1.2 | 0.5 |
| Static Friction Coefficient (against glass) | 0.6 | 1.2 | 0.6 | 0.6 | 2.5 | 1.5 | 1.6 | 0.7 |
| Blocking Resistance | A | A | A | A | C | B | B | A |
| Air Staying in Pressing | A | A | A | A | B | A | A | C |

As obvious from the results in Table 1, the solar cell encapsulant sheets of the present invention can prevent blocking and leave little air in the process of solar cell module production (Examples 1 to 4). On the other hand, the encapsulant sheets not satisfying the requirements in the present invention provided any phenomenon of blocking or air staying in the process of solar cell module production (Comparative Examples 1 to 4).

INDUSTRIAL APPLICABILITY

The solar cell encapsulant sheet of the present invention is free from a problem of blocking in unwinding and can be therefore produced efficiently in a roll-to-roll working system. In addition, the solar cell encapsulant sheet of the present invention is hardly troubled by a problem of wrinkling or air staying in a process of solar cell module production, and therefore makes it possible to efficiently produce high-quality solar cell modules.

The invention claimed is:

1. A solar cell encapsulant sheet comprising a resin layer (S) formed of a resin composition comprising an olefin-based resin selected from the group consisting of an ethylene-α-olefin copolymer, a copolymer of propylene and another monomer copolymerizable with propylene monomer or homopolymer, and a metal salt of a copolymer of an α-olefin,
wherein the storage elastic modulus at 25° C. of the resin layer (S) is 200 MPa or less, at least one surface of the resin layer (S) is the sheet surface of the encapsulant sheet, and the sheet surface satisfies the following requirements:
(a) the dynamic friction coefficient on a tempered white glass plate is 1.5 or less,
(b) the surface roughness Rzjis is from 0.1 to 40 μm,
(c) the static friction coefficient on a tempered white glass plate is 1.5 or less,
(d) the surface roughness Ra is from 0.5 to 5 μm, and
(e) an emboss profile that is a non-periodic emboss profile.

2. The solar cell encapsulant sheet according to claim 1, wherein the storage elastic modulus at 25° C. of the resin layer (S) is 100 MPa or less.

3. The solar cell encapsulant sheet according to claim 1, wherein the surface roughness Rzjis is from 5 to 40 μm.

4. The solar cell encapsulant sheet according to claim 1, wherein the olefin-based resin is an ethylene-α-olefin copolymer.

5. The solar cell encapsulant sheet according to claim 1, wherein the storage elastic modulus at 25° C. of the resin layer (S) is 50 MPa or less.

6. The solar cell encapsulant sheet according to claim 1, which is a laminate comprising at least two layers comprising the resin layer (S) and any other resin layer (T) not the same as the resin layer (S).

7. The solar cell encapsulant sheet according to claim 6, wherein the laminate has a two-type three-layer configuration that has the resin layer (S), the resin layer (T) and the resin layer (S) as laminated in that order.

8. A solar cell encapsulant sheet roll formed by rolling up the solar cell encapsulant sheet of claim 1.

9. A solar cell module that comprises the solar cell encapsulant sheet of claim 1.

10. The solar cell encapsulant sheet according to claim 1, wherein the olefin-based resin is propylene copolymer.

11. The solar cell encapsulant sheet according to claim 1, wherein the olefin-based resin is the metal salt of a copolymer of an α-olefin and an aliphatic unsaturated carboxylic acid.

12. The solar cell encapsulant sheet according to claim 1, wherein the olefin-based resin further comprises one or more of a silane coupling agent, an antioxidant, a UV absorbent, a weather-resistant stabilizer, a light diffusing agent, a nucleating agent, a pigment, a flame retardant, a crosslinking agent, a crosslinking promoter, and/or a discoloration inhibitor.

13. The solar cell encapsulant sheet according to claim 1, wherein the encapsulant sheet has a thickness of 0.5 mm or less.

* * * * *